United States Patent
Chen et al.

(10) Patent No.: US 10,312,169 B1
(45) Date of Patent: Jun. 4, 2019

(54) SUBSTRATE AND PACKAGE MODULE INCLUDING THE SAME

(71) Applicant: LINGSEN PRECISION INDUSTRIES, LTD., Taichung (TW)

(72) Inventors: Yu-Shiang Chen, Taichung (TW); Chao-Wei Yu, Taichung (TW); Yu-Lin Hsiao, Taichung (TW); Ming-Te Tu, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

(21) Appl. No.: 15/895,259

(22) Filed: Feb. 13, 2018

(30) Foreign Application Priority Data

Dec. 27, 2017 (TW) .............................. 106146083 A

(51) Int. Cl.
*H01L 23/10* (2006.01)
*H01L 23/057* (2006.01)
*H01L 23/60* (2006.01)

(52) U.S. Cl.
CPC ............ *H01L 23/10* (2013.01); *H01L 23/057* (2013.01); *H01L 23/60* (2013.01)

(58) Field of Classification Search
CPC ........ H01L 23/10; H01L 23/057; H01L 23/60
See application file for complete search history.

(56) References Cited

U.S. PATENT DOCUMENTS

2006/0118925 A1\* 6/2006 Macris .................... H01L 23/26
257/667
2018/0255639 A1\* 9/2018 Bergman ............... H05K 1/118

\* cited by examiner

*Primary Examiner* — Elias Ullah
(74) *Attorney, Agent, or Firm* — Muncy, Geissler, Olds & Lowe, P.C.

(57) ABSTRACT

A substrate includes a substrate body and an interconnection layer disposed on a bearing surface of the substrate body and having an annular portion and a plurality of protrusions extending outward from an outer periphery of the annular portion. A package module is formed by the substrate, a chip mounted on the bearing surface of the substrate body, and a cap enclosing the chip and having a bottom thereof adhered to the interconnection layer of the substrate by an adhesive. By means of the protrusions of the interconnection layer, the bonding area of the adhesive is increased and the spread of the adhesive is effectively concentrated.

6 Claims, 4 Drawing Sheets

SUBSTRATE AND PACKAGE MODULE INCLUDING THE SAME

BACKGROUND OF THE INVENTION

1. Field of the Invention

The present invention relates to package technology, and more particularly to a substrate and a package module including the substrate.

2. Description of the Related Art

The conventional package module is manufactured in a way that a metal ring is disposed on an upper surface of a substrate, a chip is then mounted on the upper surface of the substrate, and finally a solder paste is provided on the metal ring and a cap is attached to the metal ring through the solder paste. However, because the size of the package module is getting smaller, the flexibility of substrate layout will be limited by the metal ring. If the metal ring is too wide, there is insufficient space for better substrate layout, and if the metal ring is too narrow, the solder paste may be gathered in a certain area. As a result, the conventional package module still has drawbacks and therefore needs improvements.

SUMMARY OF THE INVENTION

It is a primary objective of the present invention to provide a substrate for a package module, which has the advantages of lowering costs, increasing available layout space, and reducing the size of the package module.

To attain the above objective, the present invention provides a substrate which includes a substrate body and an interconnection layer disposed on a bearing surface of the substrate body and having an annular portion and a plurality of first protrusions extending outward from an outer periphery of the annular portion.

Preferably, the interconnection layer has a plurality of second protrusions extending inward from an inner periphery of the annular portion.

Preferably, the annular portion and the first protrusions are formed integrally.

Preferably, the annular portion and the first protrusions are manufactured from metal.

It is a secondary objective of the present invention to provide a package module which includes the aforesaid substrate, a chip mounted on the bearing surface of the substrate body and surrounded by the annular portion of the interconnection layer, and a cap enclosing the chip and having a bottom thereof adhered to the interconnection layer of the substrate by an adhesive.

Preferably, the interconnection layer has a plurality of second protrusions extending inward from an inner periphery of the annular portion.

Preferably, the adhesive is solder paste.

Preferably, the annular portion and the first protrusions are formed integrally from metal.

It can be understood from the above illustration that when the bottom of the cap is attached to the interconnection layer of the substrate, the adhesive can be spread on the annular portion and the first protrusions of the interconnection layer to increase the bonding area of the adhesive, such that the bonding strength between the substrate and the cap can be enhanced, and the adhesive can be effectively gathered on the annular portion and the first protrusions.

As a result, by means of the first protrusions of the interconnection layer, the bonding area of the adhesive is enhanced, and the bonding strength between the substrate and the cap is increased. Further, the annular portion can be configured having a width smaller than the width of the conventional metal ring to increase available layout space of the substrate and reduce the size of the package module.

DETAILED DESCRIPTION OF THE INVENTION

Figure 1:
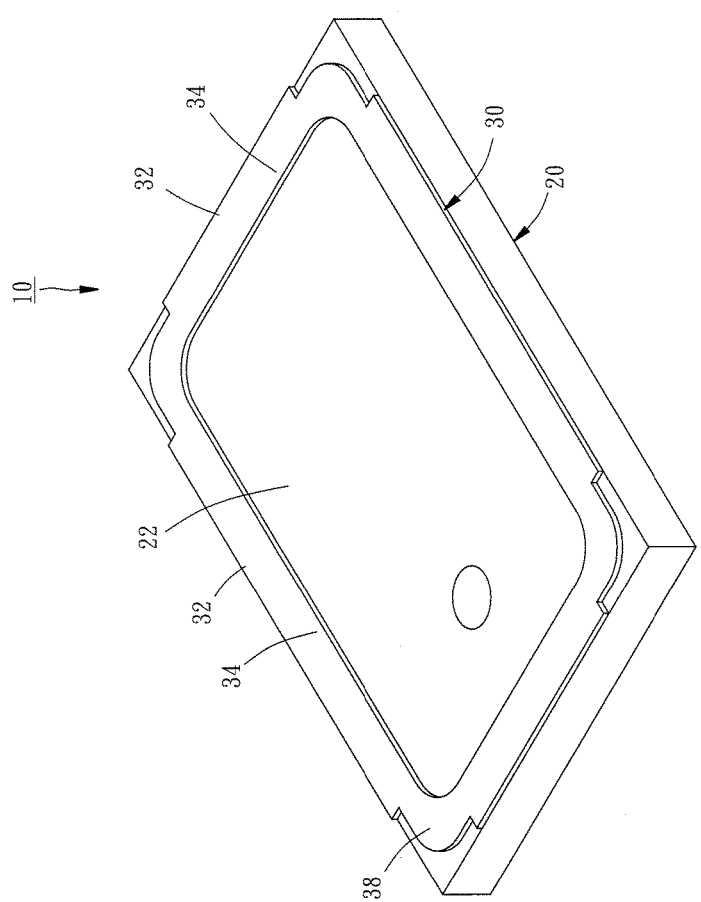
FIG. 1 is a perspective view of a substrate according to a first preferred embodiment of the present invention.

Referring to FIG. 1, a substrate 10 according to a first preferred embodiment of the present invention includes a substrate body 20 and an interconnection layer 30.

The substrate body 20 in the present embodiment may, but unlimited to, be a printed circuit board (usually referred to as "PCB"), a bismaleimide-triazine (usually referred to as "BT") substrate, a glass fiber substrate (usually referred to as "FR4"), a ceramic substrate, or a direct bonded copper (usually referred to as "DBC") substrate. As such, the substrate body 20 has a relatively lower manufacturing cost. The substrate body 20 has a bearing surface 22.

The interconnection layer 30 is disposed on the bearing surface 22 of the substrate body 20. In the present embodiment, the interconnection layer 30 is a closed circuit; however, the interconnection layer 30 may have an opening according to actual needs. The interconnection layer 30 has an annular portion 38 and a plurality of first protrusions 32 extending outward from an outer periphery of the annular portion 38. In the present embodiment, the annular portion 38 is a quadrilateral member with four lateral walls 34. The first protrusions 32 each extend outward and horizontally from the outer periphery of one of the lateral walls 34, and the first protrusions 32 each have a bottom side thereof fixedly mounted on the bearing surface 22 of the substrate body 20 and a top side thereof flush with the top sides of the lateral walls 34. Further, each of the outer peripheries of the lateral walls 34 may be provided with one or more first protrusions 32. Preferably, the outer peripheries of the two opposite lateral walls 34 have the same number of the first protrusions 32.

In the present embodiment, the first protrusions 32 and the annular portion 38 are formed integrally, and more specifically, the first protrusions 32 and the lateral walls 34 are formed integrally to reduce production process and manufacturing costs. In other embodiment, the annular portion 38 can be first formed, and then the first protrusions 32 are formed on the outer peripheries of the lateral walls 34. Besides, the annular portion 38 and the first protrusions 32 are manufactured from metal. In the present embodiment, since the annular portion 38 and the first protrusions 32 are formed integrally, they are made from the same material. In other embodiment, the annular portion 38 and the first protrusions 32 may be made from different metal according to actual needs.

Moreover, the shape of the annular portion 38 may be modified according to different requirements. For example, the annular portion 38 may be triangular, polygonal or irregular.

Figure 4:
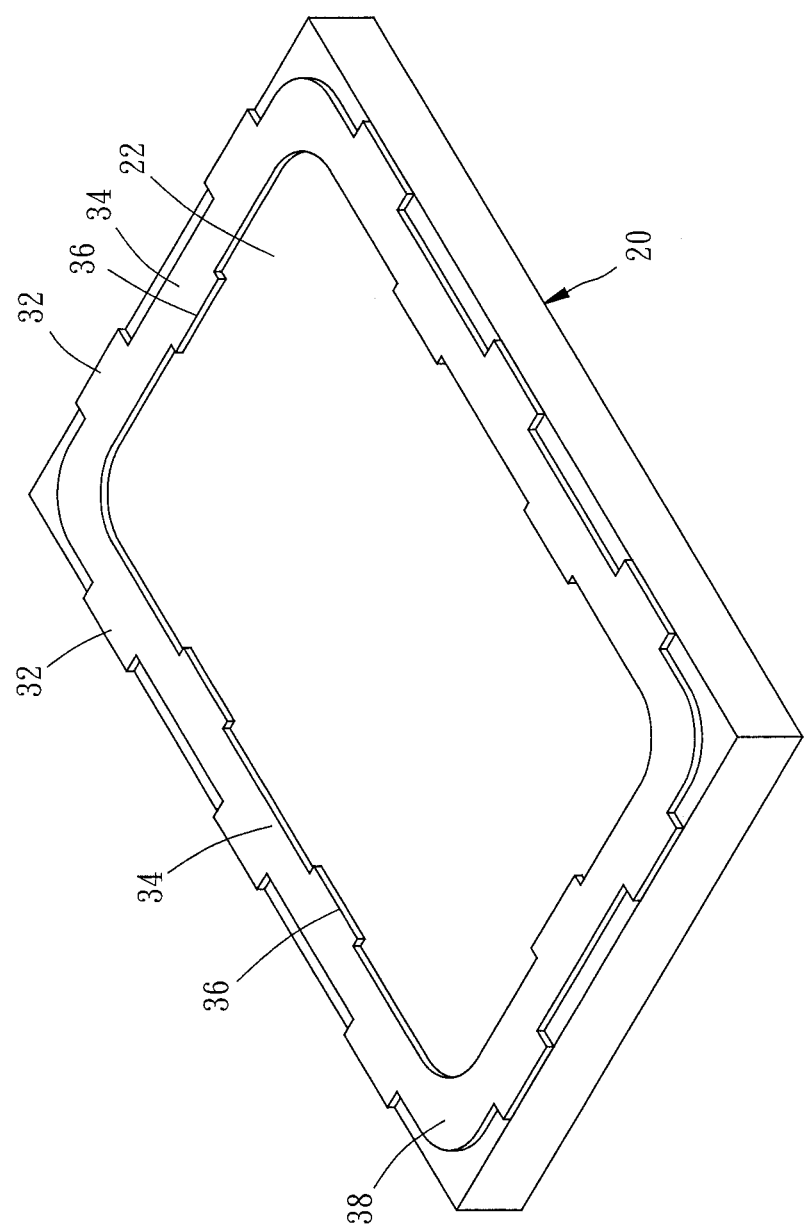
FIG. 4 is a perspective view of the substrate according to a second preferred embodiment of the present invention.

As shown in FIG. 4, in a second preferred embodiment, the interconnection layer 30 has a plurality of second protrusions 36. The second protrusions 36 each extend inward and horizontally from an inner periphery of one of the lateral walls 34, and the second protrusions 36 each have a bottom side thereof fixedly mounted on the bearing surface 22 of the substrate body 20 and a top side thereof flush with the top sides of the lateral walls 34. The second protrusions 36 and the annular portion 38 are formed integrally from the same or different metal, and furthermore, each of the inner peripheries of the lateral walls 34 may be provided with one or more second protrusions 36. Preferably, the inner peripheries of the two opposite lateral walls 34 have the same number of the second protrusions 36.

Figure 2:
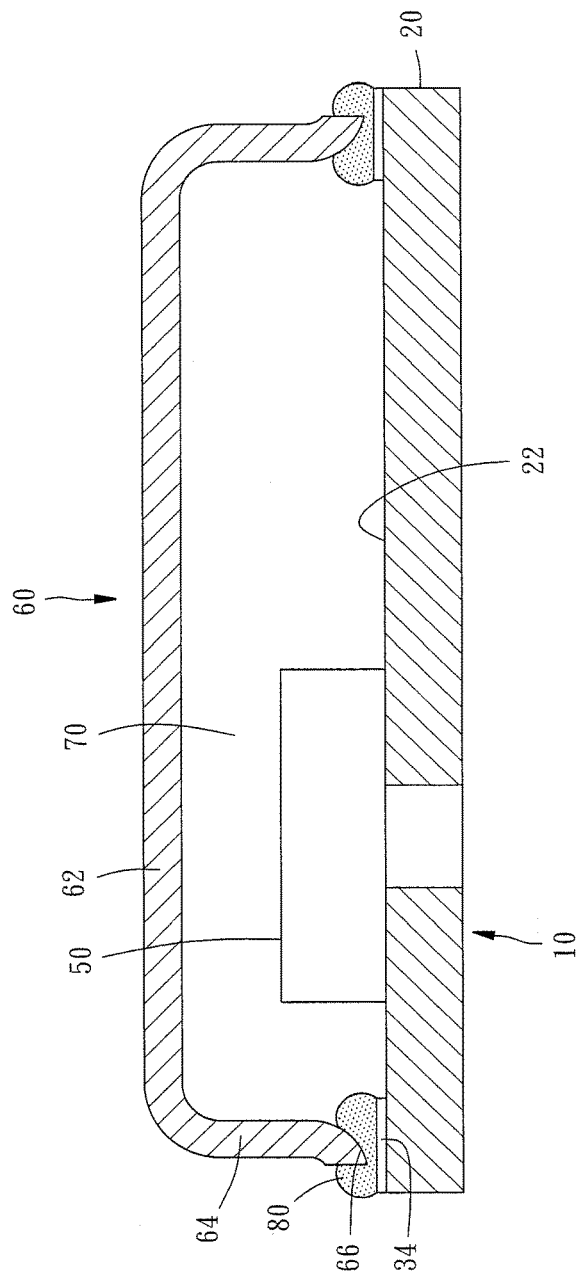
FIG. 2 is a sectional view of a package module according to the first preferred embodiment of the present invention, showing the cap is attached to the interconnection layer through the adhesive.
Figure 3:
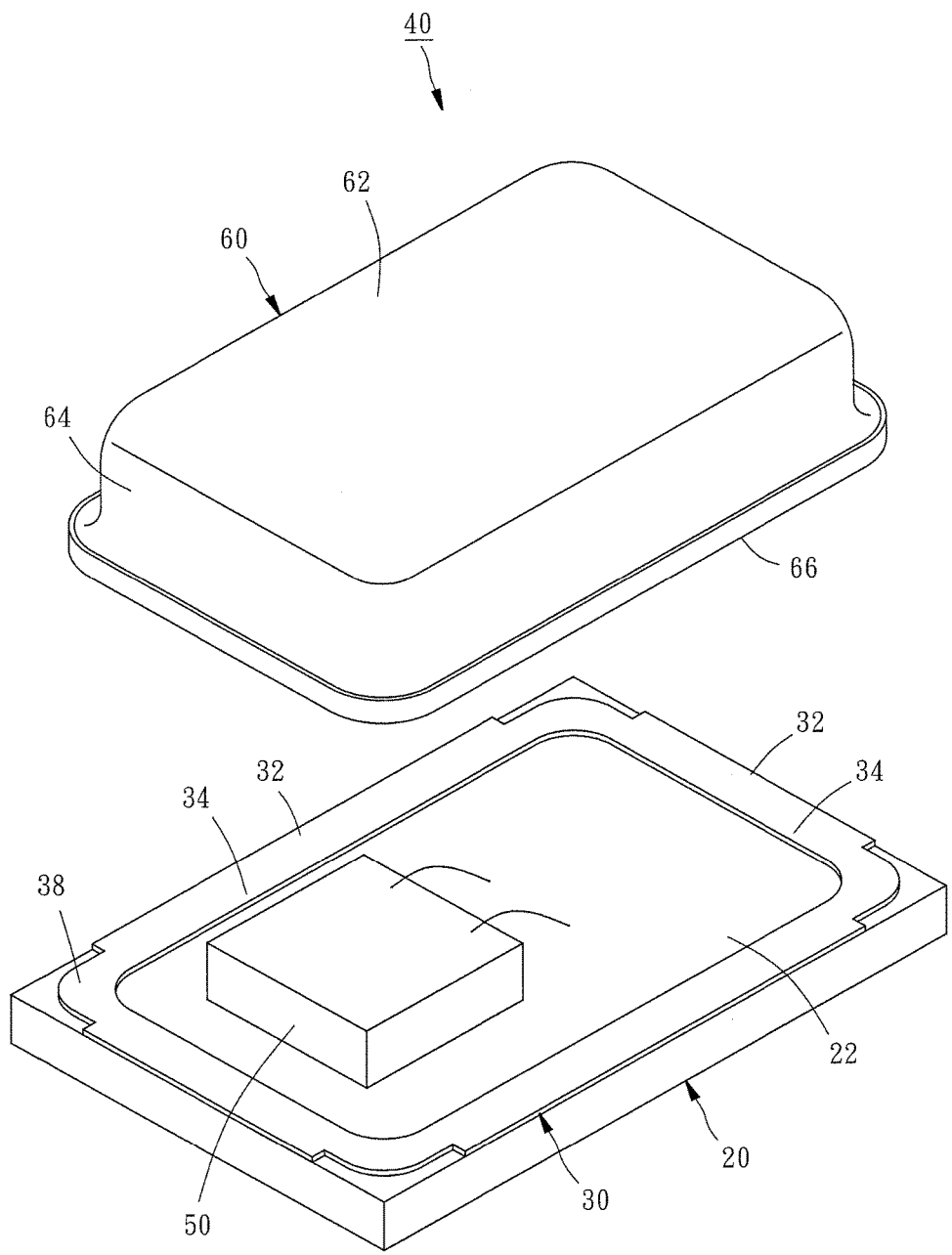
FIG. 3 is an exploded perspective view of the package module according to the first preferred embodiment of the present invention.

As shown in FIGS. 2-3, a package module 40 of the present invention includes the aforesaid substrate 10, a chip 50, and a cap 60.

The chip 50 is mounted on the bearing surface 22 of the substrate body 20 and surrounded by the annular portion 38 of the interconnection layer 30. In the present embodiment, the chip 50 is an electric component or semiconductor component for receiving and processing electrical signals. Further, the chip 30 may be optionally and electrically connected to the interconnection layer 30 to prevent damage from static electricity.

The cap 60 is mounted on the bearing surface 22 of the substrate body 20 to define an accommodation chamber 70 with the substrate body 20 for enclosing the chip 50. In the present embodiment, the cap 60 has a top plate 62, an annular wall 64 extending downward from an outer periphery of the top plate 62, and a bottom 66 formed at a bottom end of the annular wall 64. The bottom 66 of the cap 60 is attached to the annular portion 38 and the first protrusions 32 of the interconnection layer 30 by an adhesive 80. In the present embodiment, the adhesive 80 is solder paste. Further, since the two opposite lateral walls 34 have the same number of the first protrusions 32, the adhesive 80 is spread evenly on the two opposites lateral walls 34, such that the stresses generated between the cap 60 and the two opposite lateral walls 34 are equal to each other.

In the second preferred embodiment, in addition to the annular portion 38 and the first protrusions 32, the bottom 66 of the cap 60 is attached to the second protrusions 36 of the interconnection layer 30 by the adhesive 80. Further, since the two opposite lateral walls 34 have the same number of the second protrusions 36, the adhesive 80 is spread evenly on the two opposites lateral walls 34, such that the stresses generated between the cap 60 and the two opposite lateral walls 34 are equal to each other.

In summary, when the bottom 66 of the cap 60 is adhered to the interconnection layer 30 by the adhesive 80, the adhesive 80 is spread on the top side of the annular portion 38, the top sides of the first protrusions 32, and the top sides of the second protrusions 36, such that the bonding area of the adhesive 80 is enhanced, thereby increasing the bonding strength between the substrate 20 and the cap 60 and concentrating the adhesive 80 in the annular portion 38, first protrusions 32, and second protrusions 36. Further, by means of the first and second protrusions 32, 36, each of the lateral walls 34 can be designed having a width smaller than the width of the conventional metal ring to increase available layout space of the substrate 20 and reduce the size of the package module 40, thereby enabling the package module 40 to achieve a lightweight design.

What is claimed is:

1. A substrate comprising:
   a substrate body having a bearing surface; and
   an interconnection layer disposed on the bearing surface of the substrate body and having an annular portion and a plurality of first protrusions extending outward from an outer periphery of the annular portion;
   wherein the interconnection layer has a plurality of second protrusions extending inward from an inner periphery of the annular portion, and each of the first protrusions and each of the second protrusions are interlaced with each other.

2. The substrate as claimed in claim 1, wherein the annular portion and the first protrusions are formed integrally.

3. The substrate as claimed in claim 1, wherein the annular portion and the first protrusions are manufactured from metal.

4. A package module comprising:
   a substrate as defined in claim 1;
   a chip mounted on the bearing surface of the substrate body and surrounded by the annular portion of the interconnection layer; and
   a cap enclosing the chip and having a bottom adhered to the annular portion and the first protrusions by an adhesive.

5. The package module as claimed in claim 4, wherein the adhesive is solder paste.

6. The package module as claimed in claim 4, wherein the annular portion and the first protrusions are formed integrally from metal.

* * * * *